United States Patent
Sanchez

(10) Patent No.: US 6,998,692 B2
(45) Date of Patent: Feb. 14, 2006

(54) IC PACKAGE WITH AN INTEGRATED POWER SOURCE

(75) Inventor: Justin L. Sanchez, Albuquerque, NM (US)

(73) Assignee: Qynergy Corporation, Albuquerque, NM (US)

( * ) Notice: Subject to any disclaimer, the term of this patent is extended or adjusted under 35 U.S.C. 154(b) by 0 days.

(21) Appl. No.: 10/685,249

(22) Filed: Oct. 14, 2003

(65) Prior Publication Data

US 2006/0011931 A1    Jan. 19, 2006

(51) Int. Cl.
*H01L 31/0203* (2006.01)
(52) U.S. Cl. ............................. 257/433; 257/660
(58) Field of Classification Search ................. 257/666, 257/678, 698, 778, 777, 433, 431, 428, 429, 257/659, 660, 672, 704
See application file for complete search history.

(56) References Cited

U.S. PATENT DOCUMENTS

| | | | |
|---|---|---|---|
| 2,998,550 A | 8/1961 | Collins et al. | |
| 5,055,704 A | 10/1991 | Link et al. | 307/66 |
| 5,289,034 A | 2/1994 | Hundt | 257/678 |
| 5,642,014 A | 6/1997 | Hillenius | 310/303 |
| 5,994,776 A * | 11/1999 | Fang et al. | 257/758 |
| 6,479,919 B1 | 11/2002 | Aselage et al. | 310/303 |
| 6,805,998 B2 * | 10/2004 | Jenson et al. | 429/162 |

* cited by examiner

*Primary Examiner*—Howard Weiss
*Assistant Examiner*—(Vikki) Hoa B. Trinh
(74) *Attorney, Agent, or Firm*—Patent Law Office of David G. Beck

(57) ABSTRACT

A radioactive power source resident in an IC package is provided. The power source is a stand-alone device, fabricated separately from the IC or other device that is eventually attached to the package. The power source may be attached to the packaging substrate or to another portion of the package such as the package's top member or lid. The source can be directly coupled to the mounted IC, for example via package leads, or coupled to package pins. By coupling the source to the package pins, the system provides even greater flexibility. Although the power source can use any of a variety of different cell designs, preferably an icosahdedral boride based beta cell is used.

25 Claims, 2 Drawing Sheets

IC PACKAGE WITH AN INTEGRATED POWER SOURCE

FIELD OF THE INVENTION

The present invention relates generally to IC packages and, more particularly, to an IC package that includes an integrated power source.

BACKGROUND OF THE INVENTION

Compact integration of electrical power and semiconductor devices has wide-ranging applications, ranging from distributed sensor networks to cardiac pacemakers. One method of producing the required electrical power for such devices is through the direct, solid-state conversion of nuclear energy. This method, studied since the 1950's, requires a radiation source and a suitable semiconductor junction. Power sources that are based on these techniques are commonly called nuclear batteries, radioisotope batteries, radioactive batteries, or, in the case of using a beta emitting radioisotope, beta cells.

In order to achieve the desired device miniaturization required by many applications, one approach that has been studied is the fabrication of the radiation power source and the desired semiconductor device (e.g., IC) onto a single, common substrate. For example, U.S. Pat. No. 2,998,550 discloses a device in which a plurality of semiconductor-based devices (e.g., transistors, diodes) and a radioactive power supply are combined on a single semiconductor substrate. The disclosed device geometry provides electrical isolation of each of the semiconductor-based devices from adjacent devices. One such disclosed geometry provides a plurality of radial tooth-shaped members surrounding a central region wherein each of the tooth-shaped members is used for an individual semiconductor-based device while the radioactive power source is fabricated at the substrate's center. Proposed materials for the substrate include germanium, silicon, cadmium sulfide and indium antimonide.

U.S. Pat. No. 5,642,014 discloses a self-powered semiconductor device in which a radioactive power source and an IC are formed on a substrate, the substrate preferably of p-type material. The radioactive emitter is either fabricated directly into the power source's junction, for example by diffusing tritium atoms into a metal layer formed on the junction, or placed in immediate proximity to the source's junction. The use of a separate metal tritide layer provides some control over the radioactive exposure of the manufacturing environment.

Although co-fabricating a radioactive power source and an IC onto a single substrate offers advantages in size, this approach is not without problems. First, as the same substrate is used for both devices, significant limitations are imposed on the types of power sources and devices that can be fabricated as well as the manufacturing processes that can be used. For example, assuming the devices are silicon based, only low-energy radioisotopes can be used due to silicon's low threshold for damage under nuclear radiation. Second, unless the structure shields the IC from the radiation source, the device may become damaged or exhibit radiation-induced noise or false measurements.

Accordingly, what is needed in the art is a radiation powered device that does not suffer from the shortcomings of the prior art. The present invention provides such a device.

SUMMARY OF THE INVENTION

The present invention provides a means of supplying power to an IC or other, similarly packaged device. Mounted to the IC package is a stand-alone radioactive power source. By using a stand-alone power source as opposed to one fabricated on the same substrate as that used to fabricate the IC allows the power source to be fabricated in a separate process and, if desired, a separate facility from the IC, thereby limiting the facilities and the personnel that must be exposed to the radiation source. This approach also eliminates the manufacturing complexities typically associated with fabricating two separate devices on a single chip in which the two devices may be comprised of very different materials. Additionally, the present invention provides superior design and manufacturing flexibility since the same IC package can be used with a variety of different devices, including previously designed and fabricated chips that would benefit from the inclusion of a localized power source. In essence this approach allows designers to optimize the match between the requirements placed on the power source and an individual chip, all without placing limitations on the design of either.

In one aspect of the invention, the stand-alone power source is mounted to the IC package. Mounting techniques include the use of eutectics, epoxies and glass frit materials. The power source can be mounted on the package substrate, for example on an area adjacent to the IC. Alternately, the power source can be mounted in another portion of the package such as the package's top member or lid. In at least one embodiment the power source is encased in a shielded enclosure prior to mounting to the package.

In another aspect of the invention, the stand-alone power source is coupled to the IC mounted in the package via package leads (e.g., metal traces). Alternately, the power source can be coupled to package pins, thus allowing the source to be connected to either the chip resident in the package or to an external device using external interconnects.

In another aspect of the invention, the stand-alone power source is a beta cell. In at least one embodiment, the beta cell is based on icosahedral boride semiconductor materials.

A further understanding of the nature and advantages of the present invention may be realized by reference to the remaining portions of the specification and the drawings.

DESCRIPTION OF THE SPECIFIC EMBODIMENTS

Figure 1:
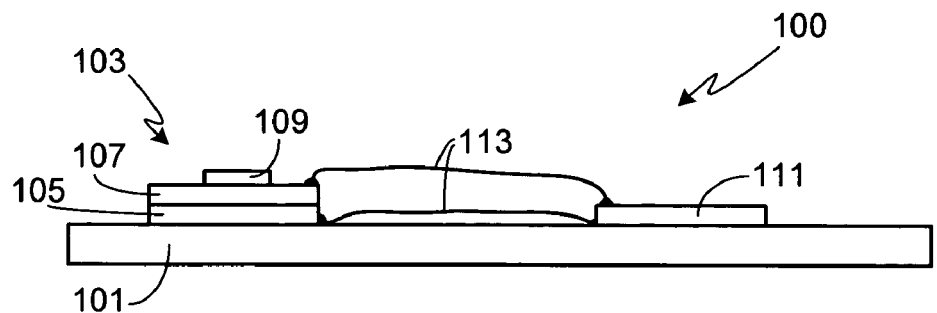
FIG. 1 is a cross-sectional view of a device according to the prior art.

FIG. 1 is a cross-sectional view of a device 100 according to the prior art. Device 100 is fabricated on a single substrate 101, for example comprised of p-type material. A radioactive power source 103 is fabricated on one portion of substrate 101, source 103 including a pn junction comprising n layer 105 and p+ layer 107. A radioactive source 109 emits alpha, gamma or beta particles as desired for the particular application. As the radioactive particles pass through the semiconductor material, electrons are excited, thereby creating electron-hole pairs. The local electric field at the semiconductor junction (i.e., the pn junction formed by layers 105 and 107) separates the paired electrons and holes to produce an electric current. In device 100, the current produced by radioactive power source 103 is used to power a semiconductor device 111 (e.g., integrated circuit), device 111 being electrically connected to source 103 via electrodes 113. By forming device 111 directly onto the same substrate on which radioactive power source 103 is formed, the same manufacturing processes can be used. The approach of combining radioactive power sources and semiconductor devices on a single substrate has been disclosed in several publications, including U.S. Pat. Nos. 2,998,550 and 5,642,014, the disclosures of which are incorporated herein for any and all purposes.

Figure 2:
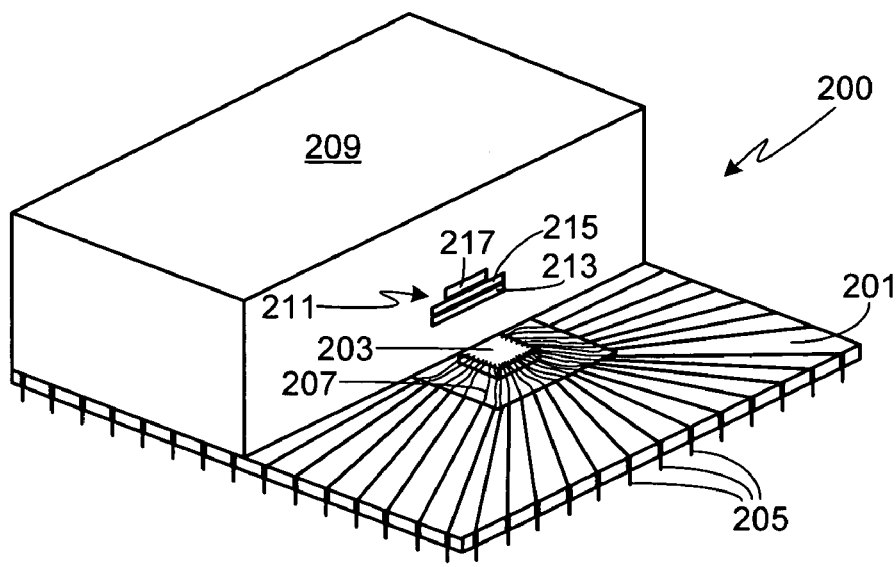
FIG. 2 is a perspective view with a partial cut-away of one embodiment of the invention.

FIG. 2 is a perspective view with a partial cut-away of an embodiment of the invention utilizing a plastic quad flat pack (PQFP) design. As shown, an IC package 200 includes a package support member 201, an IC 203, a plurality of pins 205, a plurality of package leads 207 connecting pins 205 to the IC contacts or pads (not visible), and a lid 209. In this embodiment a radioactive power source 211 is contained within lid 209. Although radioactive power source 211 can be fabricated in numerous ways, typically source 211 contains at least one pn junction comprising an n layer 213 and a p layer 215 as well as a radioactive source 217.

Figure 3:
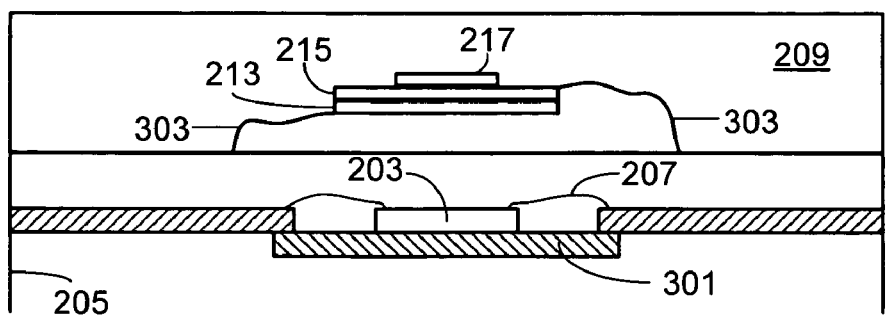
FIG. 3 is a cross-sectional view of the IC package shown in FIG. 2.

FIG. 3 is a cross-sectional view of the IC package shown in FIG. 2. In addition to the previously described elements, FIG. 3 also shows IC die support member 301 and a pair of leads 303 that are used to couple power source 211 to IC 203.

Maintaining the radioactive power source as a stand-alone (i.e., isolated) power source as opposed to fabricating the power source on the same substrate as that of the IC offers several previously unrealized advantages.

(1) The powered package allows the power source, and more importantly the radioactive source within the power source, to be easily shielded from the IC and from other components comprising the electronic system. As such, concerns of either damaging or generating false signals within the IC or near-by electronic components are minimized if not completely eliminated.

(2) A single powered package can be used with a variety of different ICs resulting in significant cost savings in chip design and production and greatly increased manufacturing flexibility. For example, without requiring any redesign of the chip or any different production steps, the same IC can be used in applications that would benefit from a local power source as well as those in which the IC is being used with a larger electronic system and hence does not required a localized power source. In the first application the IC would be used in conjunction with a powered package while in the second application the IC would be used in conjunction with a standard, non-powered package. This approach also allows previously designed and produced chips to gain the advantages offered by using the chip with a local power source.

(3) By including the power source in the package, rather than on the chip itself, radiation exposure can be greatly limited. Thus the powered package can be manufactured in a different facility or a segregated portion of the same facility. As a consequence, exposure of personnel as well as sensitive semiconductor materials can be controlled. Given the precautions and regulations relating to the storage and handling of radioactive materials, this benefit can result in substantial savings during the manufacturing process.

(4) Fabricating the radioactive power source separate from the semiconductor device provides greater manufacturing flexibility. For example, the processing steps required to fabricate the power source can easily contaminate and damage the semiconductor device structure unless suitable precautions are undertaken. These precautions can lead to the addition of substantial processing complexities. By fabricating the power source separately from the semiconductor device, neither device's manufacturing process is harmed or even limited.

(5) Manufacturing the power source as part of the package rather than the chip allows greater flexibility in the use of the power source. For example, even though the power source may be in the same package as that used to mount a particular IC, the power source can actually be used to power a different IC or component. This can be easily accomplished by simply having a portion (e.g., 2) of the package pins be dedicated to the power source as opposed to the IC. By appropriately coupling the source pins to the desired non-packaged component(s), the package can supply power to these other components.

(6) Although the packaged power source can be hardwired to the IC contained in the package (i.e., using electrode traces on the package substrate), by dedicating package pins to the power source as well as the on-board device, the two devices can be electrically coupled at any subsequent time. This feature provides additional design flexibility by allowing the power to be removed from the chip at any time, for example as may be required to clear chip registers, configure the chip, etc.

Figure 4:
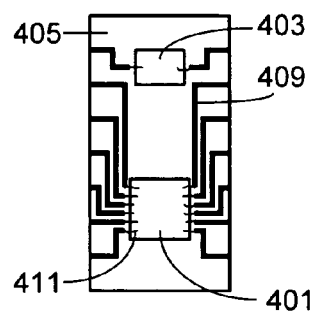
FIG. 4 is a planar view of an embodiment of the invention utilizing a DIP.
Figure 5:
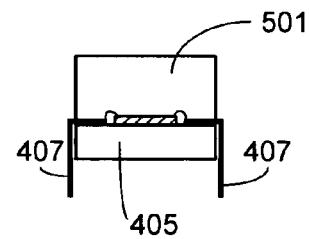
FIG. 5 is a cross-sectional view of the embodiment shown in FIG. 4.

It will be appreciated that the present invention can utilize virtually any type of IC package although some IC packages may not offer all of the advantages outlined above. FIGS. 4 and 5 provide planar and cross-sectional views of a dual in-line package (i.e., DIP), respectively. As shown, IC 401 and radioactive power source 403 are both coupled to a mounting substrate 405. A plurality of pins 407 and corresponding electrodes 409 are coupled to IC 401 and power source 403 via wire connects 411. After completion of the wiring, a top portion 501 of the package is attached to bottom mounting substrate 405. If desired, portions 405 and 501 may be hermetically sealed together.

Figure 6:
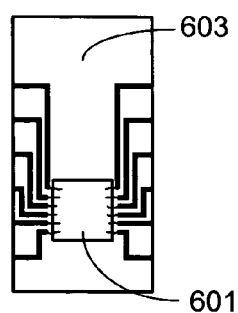
FIG. 6 is a planar view of a bottom portion of a DIP in which the IC is coupled to the bottom portion of the package and the radioactive power source is coupled to the top portion of the package.
Figure 7:
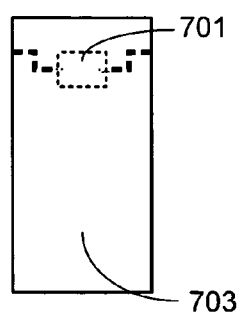
FIG. 7 is a planar view of the top package portion of the DIP illustrated in FIG. 6.
Figure 8:
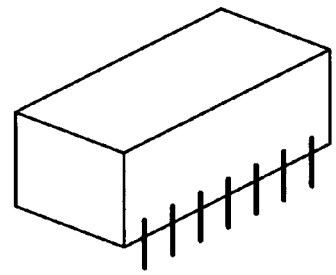
FIG. 8 is a perspective view of the completed DIP shown in FIGS. 6 and 7.

FIGS. 6–8 illustrate a slight variation of the previously shown DIP package. In this embodiment, IC 601 is attached to the bottom package portion 603 while the radioactive power source 701 is attached to the top package portion 703. Preferably power source 701 is contained within top package portion 703, thus providing further radiation containment prior to coupling top portion 703 to bottom portion 603. In this embodiment two of the plurality of pins are coupled to power source 701 while the remaining pins are coupled to IC 601. Preferably when the top and bottom package portions are coupled together, the pins are in alignment as shown in FIG. 8 such that the casual observer would not be able to distinguish this DIP from a non-powered DIP.

Figure 9:
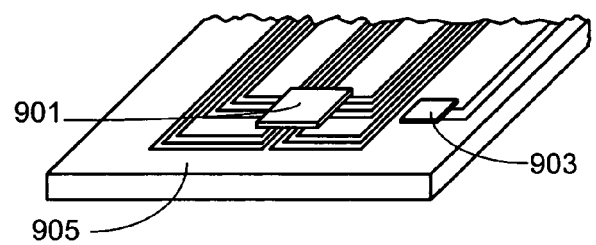
FIG. 9 illustrates a flip chip and a radioactive power source attached to a substrate using solder balls.

It will be appreciated that although the previous examples were based on DIP and PQFP packages, the present invention is equally applicable to other IC package designs. For example, the inventor clearly envisions that radioactive power sources can also be implemented in single in-line packages (SIPs), ceramic flatpacks, pin grid array (PIN) packages, small outline IC (SOIC) packages, quarter size small outline packages (QSOPs), leadless chip carriers (LCCs), plastic leaded chip carriers (PLCCs) or any other type of package. Furthermore, the radioactive power source of the invention can be mounted in the package lid or it can be surface mounted, for example as illustrated in FIG. 9 in which a flip chip 901 and a radioactive power source 903 are both surface mounted to a ceramic substrate 905 using solder balls. It will be appreciated that the package shown in FIG. 9 may be a single chip package or a portion of a multi-chip module (MCM). Additionally, the radioactive power source can be directly coupled to the resident chip, for example using electrode traces on the package substrate to connect the two devices, or the power source can be indirectly coupled to the resident chip or another device using a portion of the package pins that are dedicated to the source as previously described.

It will also be appreciated that although the present specification refers to semiconductor packages or IC packages, the powered package of the present invention can be used with any device commonly used with an IC package, known variously as an IC, semiconductor, semiconductor device, MEMS device, etc., and the use of only one of these terms in describing a particular embodiment is meant to simplify the description, not limit the scope of the invention to a particular type of device.

It should also be understood that as used herein, the substrate onto which the radioactive power source or IC is mounted is a package mounting substrate or leadframe, this substrate being different from the one used during the fabrication of either the radioactive power source or the IC. Although a variety of materials can be used for the mounting or package substrate, typical materials include ceramics, plastics and printed circuit boards (PCBs). As previously illustrated, the power source and the IC can be mounted on the same substrate or different substrates. Attachment techniques for attaching the devices to the substrate(s) include the use of eutectics, epoxies and glass frit materials. Bonding pads on the IC and the radioactive power source are typically connected to the electrodes on the package or leadframe using wires although solder balls may also be used (e.g., with flip-chip mountings). The wires are preferably bonded using thermocompression, ultrasonics, or thermosonic ball bonding. The package top or lid can be fabricated from any suitable material such as plastics or ceramics. In accordance with the invention, the package can either be hermetically or non-hermetically sealed.

A powered package in accordance with the present invention can utilize any radioactive power source as long as the source meets the power and life requirements of the device(s) for which it is intended. Accordingly, the power source can be based on beta, alpha or gamma emitting materials and can utilize any of a variety of materials that are known to create electron-hole pairs when excited. The power source can be based on a homo-junction, a hetero-junction or any other semiconductor structure (e.g., metal-oxide-semiconductor structure) capable of generating current in response to radiation bombardment. Preferably the radioactive power source uses beta particles (i.e., a beta cell). Although conventional semiconductor materials can be used such as Si, Ge, GaAs or CdTe, preferably the source of the invention is comprised of an icosahedral boride semiconductor and therefore is resistant to long-term conventional radiation-induced damage that may significantly degrade the source's performance. Icosahedral boride based beta cells suitable for use with the present invention are disclosed in U.S. Pat. No. 6,479,919, the disclosure of which is incorporated herein for any and all purposes.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A semiconductor package comprising:
   a package support member;
   a top package member coupled to said package support member;
   a plurality of pins attached to said package support member;
   a plurality of package leads in electrical communication with said plurality of pins; and
   a radiation power source mounted to said semiconductor package and contained within said top package member, said radiation power source independent and separate from any ICs mounted to said package support member, wherein said radiation power source comprises at least one radioactive source and at least one semiconductor junction producing current in response to radiation emitted by said radioactive source.

2. The semiconductor package of claim 1, further comprising an IC mounted to said package support member and in electrical communication with said plurality of package leads.

3. The semiconductor package of claim 1, wherein said semiconductor package is selected from the group consisting of DIPs, PQFPs, SIPs, ceramic flatpacks, PIN packages, SOIC packages, QSOPs, LCC packages, and PLCCs.

4. The semiconductor package of claim 2, wherein said IC is a MEMs device.

5. The semiconductor package of claim 1, further comprising at least a pair of power source leads in electrical communication with at least a pair of corresponding IC package leads.

6. The semiconductor package of claim 1, further comprising at least a pair of power source leads in electrical communication with at least a pair of said plurality of pins attached to said package support member.

7. The semiconductor package of claim 1, wherein said radiation power source is a beta cell.

8. The semiconductor package of claim 7, wherein said beta cell is comprised of an icosahedral boride semiconductor.

9. The semiconductor package of claim 1, wherein said at least one semiconductor junction is comprised of a homo-junction.

10. The semiconductor package of claim 1, wherein said at least one semiconductor junction is comprised of a hetero-junction.

11. The semiconductor package of claim 1, wherein said radiation power source is mounted to said semiconductor package via eutectics.

12. The semiconductor package of claim 1, wherein said radiation power source is mounted to said semiconductor package via epoxies.

13. The semiconductor package of claim 1, wherein said radiation power source is mounted to said semiconductor package via glass frit materials.

14. The semiconductor package of claim 1, further comprising radiation shielding.

15. The semiconductor package of claim 14, wherein said radiation shielding at least partially encompasses said radiation power source.

16. The semiconductor package of claim 1, wherein said top package member is hermetically sealed to said package support member.

17. The semiconductor package of claim 1, wherein said top package member is hermetically sealed to said package support member.

18. The semiconductor package of claim 1, wherein said package support member is fabricated from a ceramic, a plastic or a PCB.

19. The semiconductor package of claim 1, wherein said radiation power source is connected to a portion of said plurality of package leads via wire interconnects.

20. A semiconductor package comprising:
   a package support member;
   an IC die support member mounted to said package support member;
   an IC mounted to said IC die support member, said IC having a plurality of contact pads;
   a plurality of package leads on said package support member;
   a plurality of wire interconnects in electrical communication with said plurality of contact pads and said plurality of package leads;
   a plurality of pins in electrical communication with said plurality of package leads;
   a package lid attached to said package support member; and
   a radiation power source contained within said package lid, said radiation power source independent and separate from any ICs mounted to said IC die support member, wherein said radiation power source comprises at least one radioactive source and at least one semiconductor junction producing current in response to radiation emitted by said radioactive source.

21. The semiconductor package of claim 20, wherein said semiconductor package is selected from the group consisting of DIPs, PQFPs, SIPs, ceramic flatpacks, PIN packages, SOIC packages, QSOPs, LCC packages, and PLCCs.

22. The semiconductor package of claim 20, wherein said radiation power source is a beta cell.

23. The semiconductor package of claim 22, wherein said beta cell is comprised of an icosahedral boride semiconductor.

24. The semiconductor package of claim 20, wherein said at least one semiconductor junction is comprised of a homo-junction.

25. The semiconductor package of claim 20, wherein said at least one semiconductor junction is comprised of a hetero-junction.

* * * * *